United States Patent
Cho et al.

(10) Patent No.: US 9,978,293 B2
(45) Date of Patent: May 22, 2018

(54) DISPLAY DEVICE WITH CURVATURE CHANGING UNIT

(71) Applicant: LG Display Co., Ltd., Seoul (KR)

(72) Inventors: SeokHyo Cho, Goyang-si (KR); Yongjoon Jeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/379,803

(22) Filed: Dec. 15, 2016

(65) Prior Publication Data

US 2017/0193863 A1    Jul. 6, 2017

(30) Foreign Application Priority Data

Dec. 30, 2015 (KR) .................. 10-2015-0189197

(51) Int. Cl.
| | |
|---|---|
| *G09F 9/30* | (2006.01) |
| *H05K 5/00* | (2006.01) |
| *H05K 5/02* | (2006.01) |
| *H05K 5/03* | (2006.01) |
| *G02F 1/1333* | (2006.01) |
| *G02F 1/1335* | (2006.01) |

(52) U.S. Cl.
CPC ........... *G09F 9/301* (2013.01); *H05K 5/0017* (2013.01); *H05K 5/0217* (2013.01); *H05K 5/03* (2013.01); *G02F 1/133305* (2013.01); *G02F 1/133308* (2013.01); *G02F 1/133528* (2013.01); *G02F 2001/133314* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,058,758 | B2 * | 6/2015 | Shin | G09G 3/3688 |
| 9,081,540 | B1 * | 7/2015 | Cho | G06F 1/1601 |
| 9,116,662 | B1 * | 8/2015 | Song | G06F 1/1601 |
| 9,123,290 | B1 * | 9/2015 | Cho | G06F 1/1652 |
| 9,304,539 | B2 * | 4/2016 | Song | G06F 1/1601 |
| 9,307,658 | B2 * | 4/2016 | Song | H05K 5/0217 |
| 9,311,843 | B2 * | 4/2016 | Kim | G06F 1/1652 |
| 9,390,642 | B2 * | 7/2016 | Kim | G09G 3/3225 |
| 9,500,856 | B2 * | 11/2016 | Yoshikawa | G02B 26/0825 |
| 9,510,469 | B2 * | 11/2016 | Song | H05K 5/0217 |
| 9,524,660 | B2 * | 12/2016 | Lee | G09F 9/301 |
| 9,536,456 | B2 * | 1/2017 | Kang | G09F 9/301 |

(Continued)

FOREIGN PATENT DOCUMENTS

| | | |
|---|---|---|
| EP | 2782152 A3 | 5/2015 |
| EP | 2892045 A1 | 7/2015 |

(Continued)

*Primary Examiner* — Lisa Lea Edmonds
(74) *Attorney, Agent, or Firm* — Dentons US LLP (57) ABSTRACT

A display device. A back cover supports a rear surface of a display panel. A pair of support members are disposed on a left side and a right side of the back cover with respect to a central portion of the rear surface of the back cover. Outer ends of the pair of support members are fixed to the back cover. A curvature-changing unit is coupled to the central portion of the rear surface of the back cover to support the pair of support members in a lateral direction of the back cover and change a curvature of either the display panel or the back cover.

9 Claims, 6 Drawing Sheets

(56) References Cited

U.S. PATENT DOCUMENTS

| | | | | |
|---|---|---|---|---|
| 9,541,952 B2* | 1/2017 | Kang | | H01L 51/0097 |
| 9,560,775 B2* | 1/2017 | Park | | H04N 5/64 |
| 9,730,342 B2* | 8/2017 | Lee | | H05K 5/0217 |
| 9,736,951 B2* | 8/2017 | Cho | | H05K 5/0017 |
| 9,746,701 B2* | 8/2017 | Sung | | G09F 9/301 |
| 2011/0249425 A1* | 10/2011 | Aurongzeb | | F21V 14/02 |
| | | | | 362/102 |
| 2012/0281367 A1* | 11/2012 | He | | H05K 5/02 |
| | | | | 361/728 |
| 2013/0155655 A1* | 6/2013 | Lee | | H05K 5/03 |
| | | | | 362/97.1 |
| 2014/0140023 A1* | 5/2014 | Lee | | H05K 5/03 |
| | | | | 361/755 |
| 2014/0226266 A1 | 8/2014 | Kang et al. | | |
| 2014/0240906 A1* | 8/2014 | Seo | | A47B 81/06 |
| | | | | 361/679.01 |
| 2014/0247566 A1* | 9/2014 | Lee | | H05K 5/03 |
| | | | | 361/749 |
| 2014/0268584 A1 | 9/2014 | Song et al. | | |
| 2014/0314999 A1* | 10/2014 | Song | | G06F 1/1601 |
| | | | | 428/174 |
| 2014/0376163 A1* | 12/2014 | Song | | H04N 5/64 |
| | | | | 361/679.01 |
| 2015/0043136 A1* | 2/2015 | Kim | | G02F 1/133305 |
| | | | | 361/679.01 |
| 2015/0092361 A1* | 4/2015 | Cho | | H02K 7/00 |
| | | | | 361/749 |
| 2016/0028042 A1* | 1/2016 | Lee | | G02F 1/133305 |
| | | | | 361/749 |
| 2016/0040764 A1* | 2/2016 | Park | | G09F 9/301 |
| | | | | 361/679.01 |
| 2016/0127674 A1* | 5/2016 | Kim | | G09G 5/003 |
| | | | | 348/739 |
| 2016/0218316 A1* | 7/2016 | Lee | | H05K 5/03 |
| 2016/0224059 A1* | 8/2016 | Song | | G06F 1/1601 |
| 2016/0252236 A1* | 9/2016 | Chen | | G02F 1/133 |
| | | | | 362/97.1 |
| 2016/0295711 A1* | 10/2016 | Ryu | | G09F 9/301 |
| 2016/0353594 A1* | 12/2016 | Cho | | F16M 11/02 |
| 2017/0013728 A1* | 1/2017 | Lee | | F21V 7/0066 |
| 2017/0112000 A1* | 4/2017 | Park | | H04N 5/64 |
| 2017/0124937 A1* | 5/2017 | Kim | | G09G 3/2096 |
| 2017/0188470 A1* | 6/2017 | Cho | | G09F 9/301 |
| 2017/0238429 A1* | 8/2017 | Zeng | | H05K 5/0017 |
| | | | | 361/807 |

FOREIGN PATENT DOCUMENTS

| | | |
|---|---|---|
| JP | 2-57617 U | 4/1990 |
| JP | 4-16275 U | 2/1992 |
| JP | 10-26754 A | 1/1998 |
| JP | 2015-161766 A | 9/2015 |

\* cited by examiner

DISPLAY DEVICE WITH CURVATURE CHANGING UNIT

CROSS REFERENCE TO RELATED APPLICATION

This application claims priority from Korean Patent Application No. 10-2015-0189197 filed on Dec. 30, 2015, which is hereby incorporated by reference for all purposes as if fully set forth herein.

BACKGROUND

Field

The present disclosure relates to a display device and a method of manufacturing the same. More particularly, the present disclosure relates to a display device, the curvature of which is changeable according to a user selection to improve user immersion in the screen.

Description of Related Art

Generally, research into flat panel display devices, such as liquid crystal display devices, plasma display devices, and organic light-emitting display devices, has been actively undertaken. In this regard, liquid crystal display devices and organic light-emitting display devices have become prominent in terms of production technology, ease of driving, and high definition realization.

In particular, there has recently been a need for research into and development of flat panel display devices with various product designs appealing to consumers. Therefore, the demand for display devices having a degree of curvature, such as curved surface display devices or curved display devices, has been gradually increased.

To date, curved surface display devices have been developed by forming a panel and a back cover to have a predetermined curvature and coupling a fixing device having the same curvature as the back cover to the rear surface of the back cover.

Figure 1:
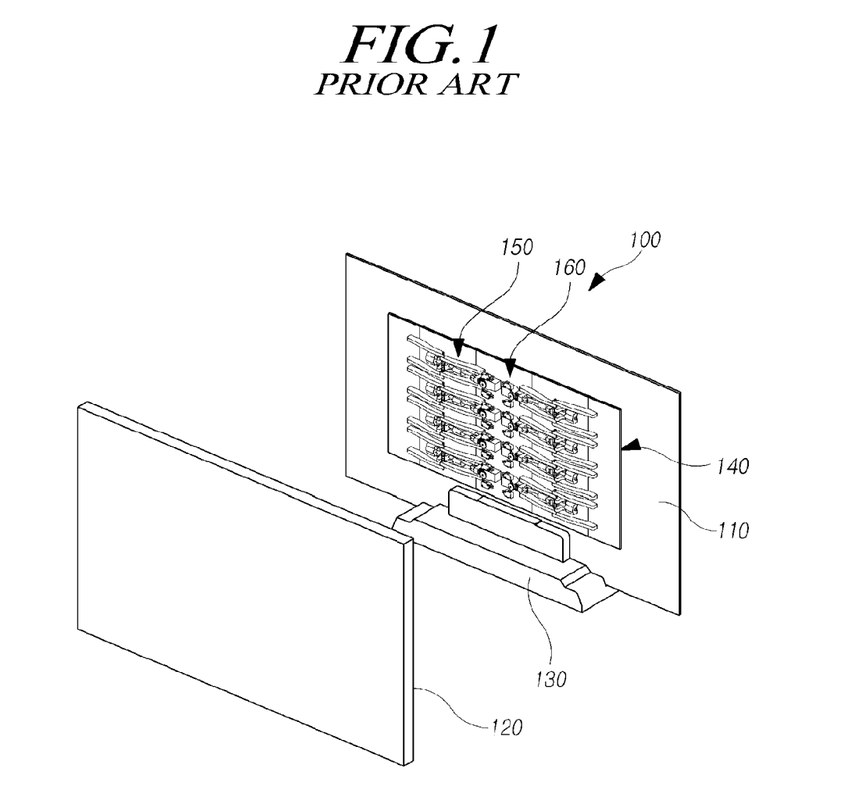
FIG. 1 is an exploded perspective view illustrating a display device according to the related art.

FIG. 1 is an exploded perspective view illustrating a display device according to the related art.

As illustrated in FIG. 1, the display device of the related art includes a display panel 110, an external case 120 accommodating the display panel 110, and a support stand 130 connected to a lower end or a rear surface of the external case 120 and fixed to a desk or a wall.

The display device of the related art operates in a flat mode and a curved mode by a curvature change device 140 disposed on a rear surface of the display panel 110. That is, a plurality of joint plates 150 connected to a plurality of motors 160 are bent at a desired angle by operating the plurality of motors 160 to change a curvature of the display panel 110.

However, such a curved surface display device or a curved display device has a structure in which respective joint plates are coupled to a rear surface of the display panel, thereby increasing the number of components, the number of operation processes and manufacturing costs.

Also, since the curvature is changed by operating the motor, operation noise may be loud and power consumption may increase. Furthermore, when the motor is broken, the external case typically needs to be separated to repair the motor.

BRIEF SUMMARY

Various aspects of the present disclosure provide a display device that allows a user to change a curvature of a display device between a flat mode and a curved mode.

Various aspects of the present disclosure provide a display device that allows the user to easily change a curvature of a display, even for a large-sized display, to be able to meet various user demands.

Advantages and objects of the present disclosure are not limited to the aforementioned configurations, and other advantages and objects not described herein will be clearly understood by a person skilled in the art from descriptions provided hereinafter.

In an aspect of the present disclosure, a display device may include: a back cover supporting a rear surface of a display panel; a pair of support members disposed on a left side and a right side of the back cover with respect to a central portion of the rear surface of the back cover, outer ends of the pair of support members being fixed to the back cover; and a curvature-changing unit coupled to the central portion of the rear surface of the back cover to support the pair of support members in a lateral direction of the back cover and change a curvature of either the display panel or the back cover.

A user can change a curvature of a display device between a flat mode and a curved mode. In addition, the user to easily change a curvature of a display, even for a large-sized display, to be able to meet various user demands.

It is to be understood that both the foregoing general description and the following detailed description are exemplary and explanatory and are intended to provide further explanation of the invention as claimed.

BRIEF DESCRIPTION OF THE DRAWINGS

The above and other objects, features and advantages of the present disclosure will be more clearly understood from the following detailed description when taken in conjunction with the accompanying drawings, in which.

DETAILED DESCRIPTION OF THE ILLUSTRATED EMBODIMENTS

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are only used to distinguish one element from another element. The substance, sequence, order or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

Figure 2:
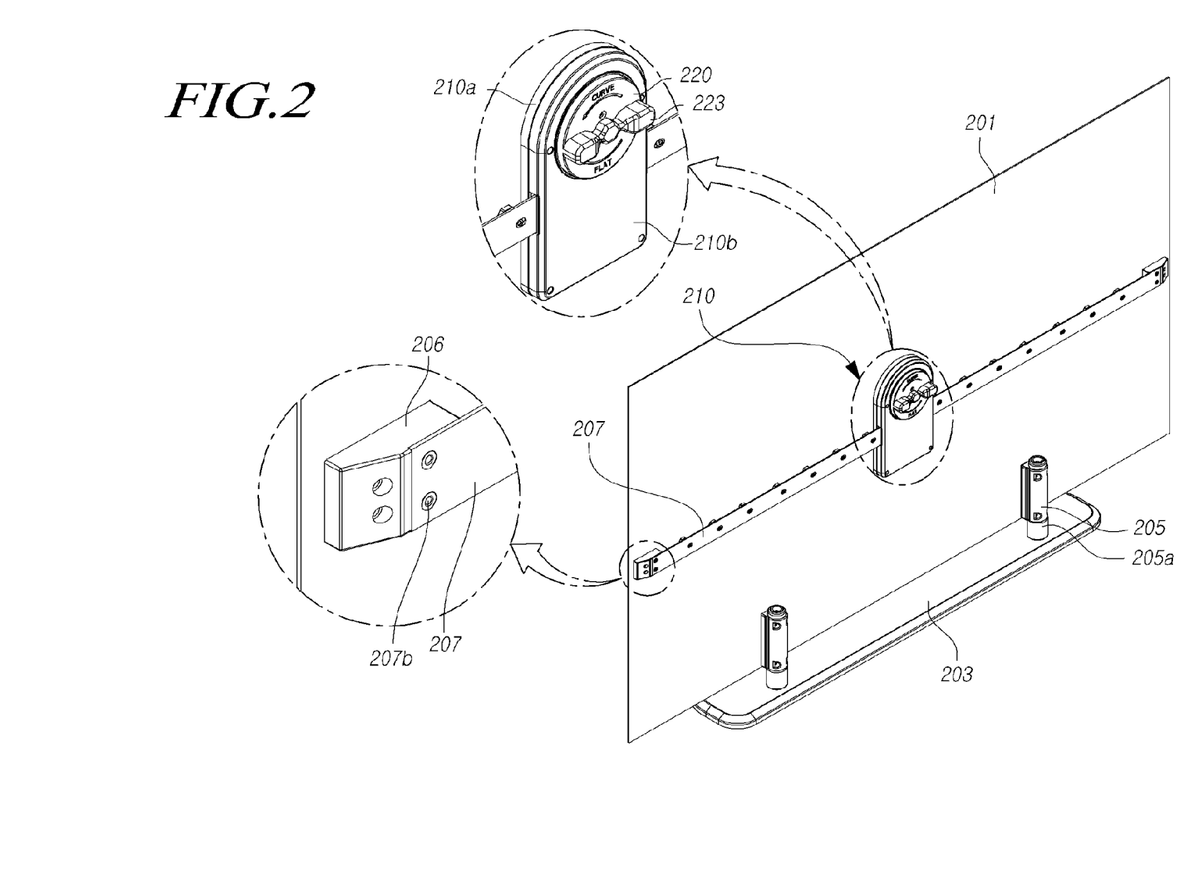
FIG. 2 is a perspective view illustrating a display device according to an exemplary embodiment.
Figure 3:
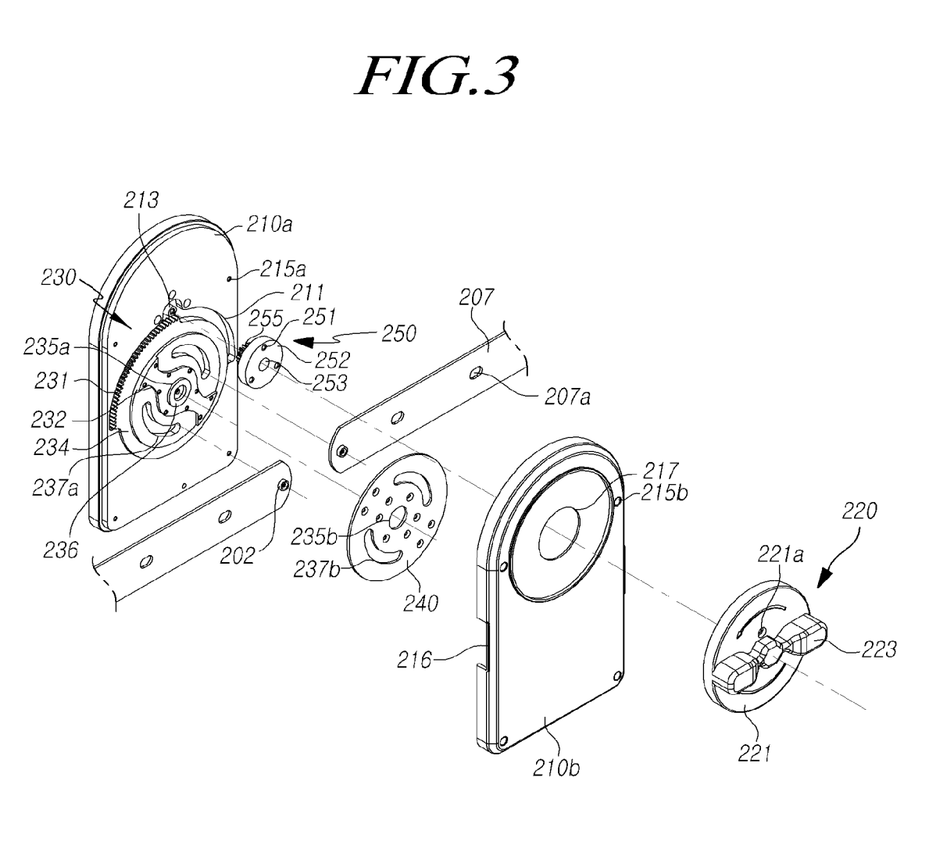
FIG. 3 is an exploded perspective view illustrating a portion of the display device of FIG. 2.
Figure 4:
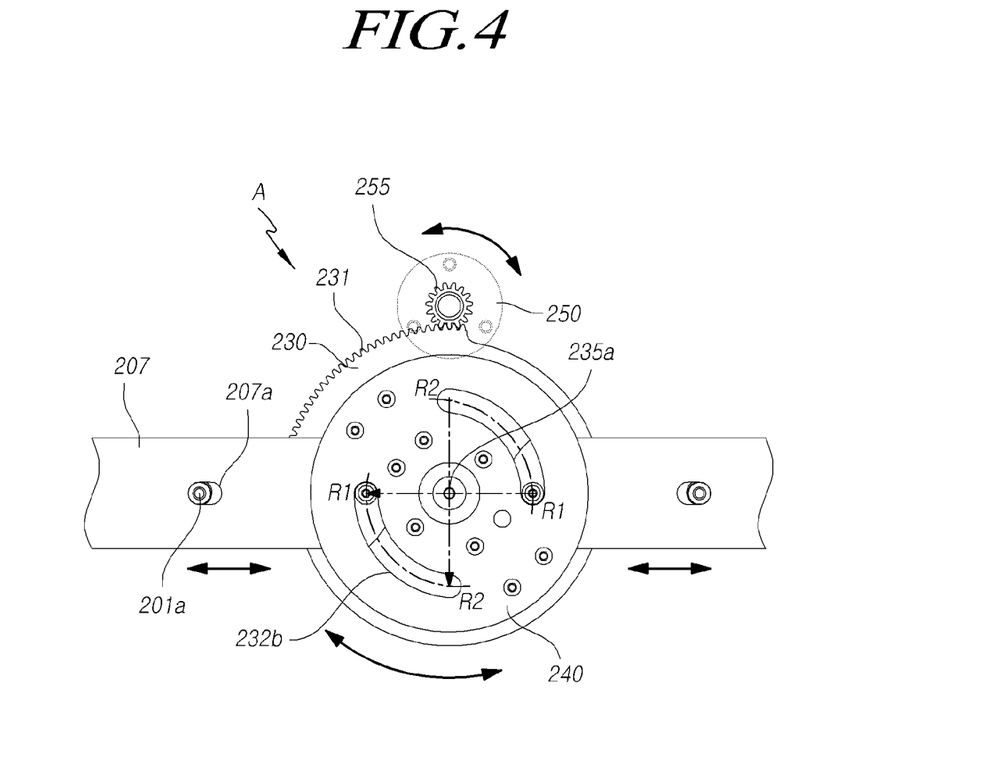
FIGS. 4 and 5 are rear views illustrating an operating state of a display device according to an exemplary embodiment.
Figure 5:
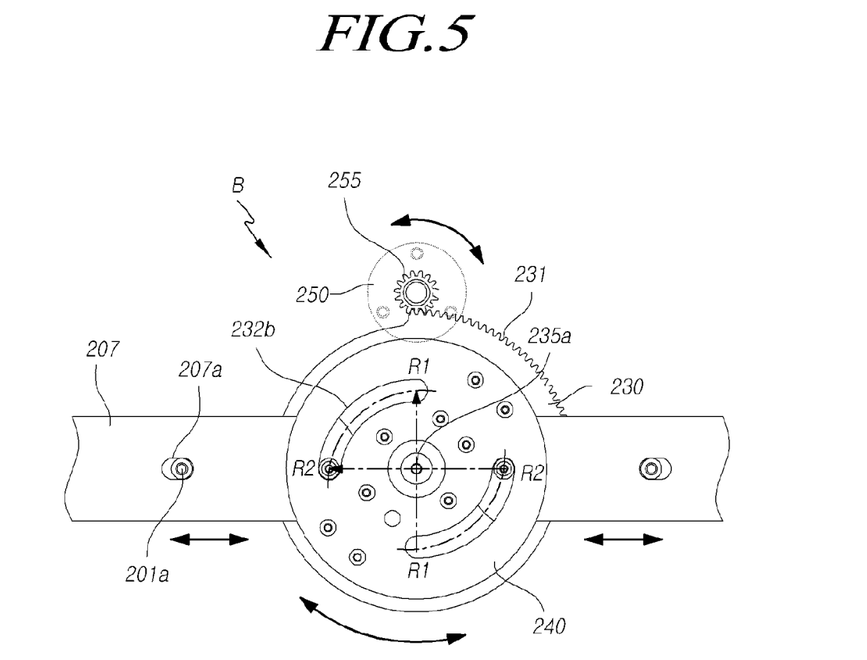
Figure 6:
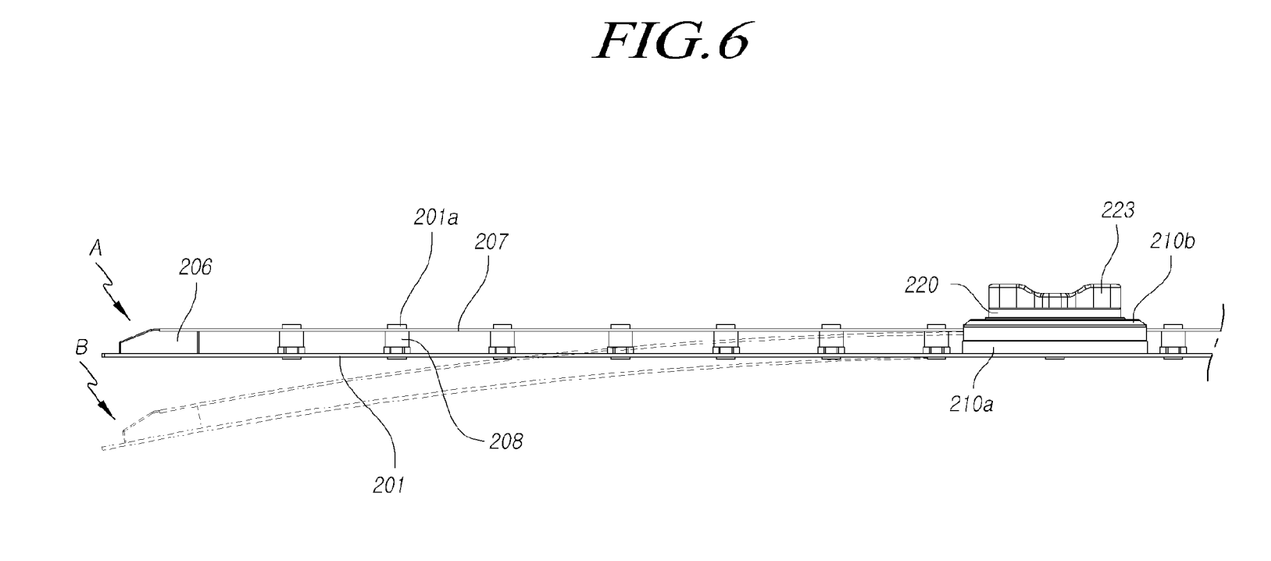
FIG. 6 is a plan view illustrating an operating state of a display device according to an exemplary embodiment.

FIG. 2 is a perspective view illustrating a display device according to an exemplary embodiment, FIG. 3 is an exploded perspective view illustrating a portion of the display device of FIG. 2, FIGS. 4 and 5 are rear views illustrating an operating state of a display device according to an exemplary embodiment, and FIG. 6 is a plan view illustrating an operating state of a display device according to an exemplary embodiment.

As illustrated in FIGS. 2 to 6, the display device according to the exemplary embodiment includes a back cover 201, a pair of support members 207, and a curvature-changing unit 210. The back cover 201 supports a rear surface of a display panel. The pair of support members 207 are disposed on a left side and a right side of the back cover 201 with respect to a central portion of the rear surface in the back cover 201. Outer ends of the support members 207 are fixed to the back cover 201. The curvature-changing unit 210 is fixed to the central portion of the rear surface of the back cover 201 to support the pair of support members 207 in a lateral direction of the back cover 201 and change a curvature of either the display panel or the back cover 201.

The back cover 201 has connection members 205 on lower portions thereof, the connection members 205 being connected to a support stand 203, such that the display device is placed on a desk or a table. When the curvature of the back cover 201 changes, the connection members 205 are rotated by a certain angle while being supported by connection shafts 205a. The display panel may be a liquid display panel or other types of display panels such as a light-emitting display panel.

When the display panel is a liquid display panel, the liquid display panel may further include a backlight unit for irradiating light to the liquid display panel, a lower polarizing plate attached to a lower substrate, and an upper polarizing plate attached to the front surface of the an upper substrate. The liquid crystal panel may have various modes known in the art such as a twisted nematic (TN) mode, a vertical alignment (VA) mode, an in-plane switching (IPS) mode, and a fringe field switching (FF) mode.

In addition, when the display panel is a light-emitting display panel, the light-emitting display panel may include a lower substrate including a plurality of light-emitting cells formed in every region defined by a gate line, a data line, and a power supply (VDD) line, and an upper substrate attached to face the lower substrate. Since such a configuration is known in the art, the drawings and detailed descriptions thereof are omitted.

As described above, an embodiment of the present disclosure is applicable to any types of display panels, the following description will be provided without regard to the specific type of the display panel.

Referring to FIG. 2, both side ends of the curvature-changing unit 210 disposed on the rear surface of the display device, i.e. the rear surface of the back cover 201, are connected to the rear surface of the back cover 201 to support and push the support members 207 outwards in a lateral direction from a central portion of the back cover 201. Accordingly, the display device may operate in a flat mode A and a curved mode B.

That is, the pair of the supports members 207 are disposed on a left side and a right side of the back cover 201 with respect to the central portion of the rear surface of the back cover 201. The outer ends of the support members 207 are fixed to the back cover 201, while the inner ends of the support members 207 adjacent to the central portion of the back cover 201 are supported outwards in a lateral direction of the back cover 201 by the curvature-changing unit 210.

When the user operates the curvature-changing unit 210, the outer ends of the support members 207 are fixed to the back cover 201 while being forced outwards in the lateral direction from the central portion of the back cover 201. Accordingly, while a buckling phenomenon occurs in the support members 207, the support members 207 may be bent to change the curvature of the back cover 201.

The support members 207 may be formed of a metal material, such as an aluminum alloy or stainless steel, which has a high degree of rigidity, capable of bending the display panel and the back cover 201. The support members 207 may be formed to have a flat-plate shape that is elongated and thin, such that elastic bending may be easily performed when the user changes the flat mode A into the curved mode B.

When the display device is in the curved mode B, the supports members 207 can be bent to have a curvature of about 2,000 mm to about 6,000 mm while supporting the rear surface of the back cover 201, so that the back cover 201 can be elastically deformed. Accordingly, the display device may be changed from the flat mode A to the curved mode B.

Referring to FIG. 3, the curvature-changing unit 210 supporting the support members 207 outwards in the lateral direction of the back cover 201 includes support protrusions 202, a driven gear 230, a driving gear 250, a driven gear support plate 240, and housings 210a and 210b.

The support protrusions 202 are formed on central portions of the inner ends of the support members 207. The driven gear 230 has first support holes 237a extending in a circumferential direction such that a distance of each of the first support holes 237a to a center of the driven gear 230 increases from one end to the other end thereof, the support protrusions 202 being accommodated into the first support holes 237a to move along the first support holes 237a. The driven gear 230 further has seating recesses 232 formed on both sides of the first support holes 237a, the inner ends of the support members 207 being seated on the seating recesses 232. The driving gear 250 is meshed with the driven gear 230 to rotate the driven gear 230. The driven gear support plate 240 is coupled to the driven gear 230 and has second support holes 237b corresponding to the first support holes 237a, the support protrusions 202 being accommodated in the second support holes 237b. The housings 210a and 210b accommodate the driven gear 230 and the driving gear 250 and are coupled to the rear surface of the back cover 201. The aforementioned curvature-changing unit 210 allows the user to conveniently change the mode of the display device between the curved mode B and the flat mode A.

The support protrusions 202 are formed adjacent to the central portions of the inner ends of the support members 207 and are accommodated in the first support holes 237a of the driven gear 230 such that the support members 207 are supported in a lateral direction by the driven gear 230 when the driven gear 230 is rotated.

The driven gear 230 further has a first coupling hole 235a in a central portion of a driven gear body 234 having a circular-plate shape. A first rotation shaft 236 provided in the housings 210a and 210b is rotatably fitted into the first coupling hole 235a of the driven gear 230. The first support holes 237a accommodating the support protrusions 202 are elongated in a circumferential direction, spaced apart from the first coupling hole 235a by predetermined distances in a diameter direction.

A distance from a center of the driven gear 230 to each of the first support holes 237a gradually increases in a circumferential direction from one end to the other end of each of the first support holes 237a such that the support members 207 are supported on both sides of the driven gear 230 when the driven gear 230 is rotated.

Specifically, a distance R2 from a center of the driven gear 230 to one end of each of the first support holes 237a is greater than a distance R1 from a center of the driven gear 230 to the other end of each of the first support holes 237a. When the driven gear 230 is rotated, the support members 207 are gradually forced away from a center of the driven gear 230 as the support protrusions 202 move along the first support holes 237a.

The operation will be described in more detail with reference to FIGS. 4 and 5.

Referring to FIG. 4 illustrating the flat mode A, the support protrusions 202 are coupled to portions of the first support holes 237a spaced apart from a center of the driven gear 230 by the distance R1, such that loads supporting the support members 207 in a lateral direction may not be applied to the support members 207. Accordingly, the support members 207 are not bent and the flat mode A is maintained.

When the user rotates the driving gear 250 in a counter-clockwise direction on a plan view, the driven gear 230 rotates in a clockwise direction. At this time, distances from a center of the driven gear 230 to the first support holes 237a gradually increase from the distance R1 to the distance R2, and thus, loads supporting the support members 207 in a lateral direction are applied to the support members 207, thereby bending the support members 207.

Thereafter, referring to FIG. 5 illustrating the curved mode B, when the driven gear 230 is completely rotated in the clockwise direction, the support protrusions 202 are coupled to portions of the first support hole 237a spaced apart from the center of the driven gear 230 by the distance R2. Then, maximum loads supporting the support members 207 in a lateral direction are applied to the support members 207, thereby bending the support members 207 by the greatest amount.

Therefore, when the rotation of the driven gear 230 is completed, loads for moving the support members 207 by a distance corresponding to R2-R1 are generated. As described above, since the outer ends of the support members 207 are fixed to the back cover 201, the support members 207 are bent as illustrated in FIG. 6. When the user changes the curved mode B into the flat mode A again, an operation opposite to the aforementioned operation is performed.

Since the seating recesses 232, on which the inner ends of the support members 207 are seated, are formed on both sides of the driven gear 230, an attachment position of the support members 207 can be determined when the driven gear 230 is attached to the housings 210a and 210b. In addition, the support members 207 can be reduced or prevented from being detached during an operation of the driven gear 230.

In addition, a first gear portion 231 is provided on a portion of an outer circumferential surface of the driven gear 230. The first gear portion 231 protrudes in a diameter direction of the driven gear 230 to be meshed with the driving gear 250. When the driving gear 250 rotates the driven gear 230, the first gear portion 231 can reduce a speed of rotation caused by the user, thereby facilitating the rotation of the driven gear 230.

The driven gear support plate 240 having the second support holes 237b, formed in positions corresponding to the first support holes 237a and in the same shape as the first support holes 237a, is coupled to an outer portion of the driven gear 230 in an axial direction thereof.

Therefore, the support members 207 are sandwiched between the driven gear 230 and the driven gear support plate 240, which are coupled to opposing portions of the support members 207. The support protrusions 202 formed on side surfaces of the support members 207 are fitted into the first support hole 237a and the second support hole 237b. Consequently, when the driving gear 250 operates, the driven gear 230 and the driven gear support plate 240 rotate in concert with each other while supporting the support members 207 in a lateral direction.

The driving gear 250, disposed on an outer circumferential surface of the driven gear 230, is provided with a second gear portion 255 meshed with the driven gear 230 and a knob 252 having a circular-plate shape in a position spaced apart from the second gear portion 255 in an axial direction thereof. The driving gear 250 is coupled to a rotation lever 220, which will be described along with the knob 252.

In addition, the driving gear 250 has a second coupling hole 253 extending through the second gear portion 255 and the knob 252, and a second rotation shaft 213 provided in the housings 210a and 210b is fitted into the second coupling hole 253. When the rotation lever 220 rotates, the driving gear 250 rotates about the second rotation shaft 213 in concert with the rotation lever 220 to rotate the driven gear 230, which can improve operational convenience for the user.

The housings 210a and 210b, which accommodate the driven gear 230 and the driving gear 250, include the lower housing (or inner housing) 210a and the upper housing (or outer housing) 210b. The lower housing 210a is coupled to the back cover 201 and has a gear accommodation recess 211 in which the driven gear 230 and the driving gear 250 are accommodated. The upper housing 210b has a through-hole 217 through which the knob 252 of the driving gear 250 extends and a support member accommodation recess 216 in both sides of which the support members 207 are accommodated. The upper housing 210b is coupled to the lower housing 210a while surrounding the driven gear support plate 240.

With the lower housing 210a and the upper housing 210b, when the user changes the mode between the curved mode B and the flat mode A, the support members 207, the driving gear 250, the driven gear 230, the driven gear support plate 240, and the like can operate while being firmly supported.

The lower housing 210a, which accommodates the support members 207, the driving gear 250, the driven gear 230, the driven gear support plate 240, and the like, together with the upper housing 210b, is coupled to the back cover 201. The lower housing 210a has coupling holes 215a allowing the lower housing 210a to be coupled to the upper housing 210b. The gear accommodation recess 211 in which the driven gear 230 and the driving gear 250 are accommodated is formed in a central portion of the lower housing 210a. The first rotation shaft 236 of the driven gear 230 and the second rotation shaft 213 of the driving gear 250 are placed in the gear accommodation recess 211.

In addition, the upper housing 210b has coupling holes 215b allowing the upper housing 210b to be coupled to the lower housing 210a. The upper housing 210b further has the through-hole 217 through which the knob 252 of the driving gear 250 extends and the support member accommodation recess 216 in both sides of which the support members 207 are accommodated. The upper housing 210b is coupled to the lower housing 210a while surrounding the driven gear support plate 240.

As a result, when the user changes the mode between the curved mode B and the flat mode A, this configuration can reduce or prevent the support members 207, the driving gear 250, the driven gear 230, and the like from being detached or deformed when the support members 207 are forced in a lateral direction of the back cover 201 while the outer ends thereof remain fixed. It may also be possible to reduce or prevent the driven gear 230 and the driving gear 250 from being exposed externally and thus, to reduce or prevent introduction of dust or impurities.

Furthermore, the rotation lever 220, by which the driving gear 250 is rotated, is coupled to an outer surface of the upper housing 210b. The knob 252 of the driving gear 250 has fastening holes 251, and the rotation lever 220 has fastening holes 221a. The fastening holes 251 and the fastening holes 221a are firmly fastened to each other using fastening members, such as bolts. When the rotation lever 220 is rotated, the driving gear 250 can rotate the driven gear 230, thereby improving operational convenience for the user.

The rotation lever 220 has a grasping portion 223 protruding from a rotation lever body 221. This configuration can reduce an operating force and improve convenience when the user operates the rotation lever 220. In some cases, in order to further reduce the operating force, the grasping portion 223 may be formed to be elongated so as to extend in a lateral direction on the rotation lever body 221.

Meanwhile, as illustrated in FIG. 6, each of the support members 207 has slit-shaped guide holes 207a extending in a lateral direction of the back cover 201. Fixing members 208 are coupled to the rear surface of the back cover 201 in positions corresponding to the guide holes 207a of the supporting members 207. Guide members 201a are coupled to the fixing members 208 through the guide holes 207a.

With this configuration, the guide members 201a support the support members 207 toward the back cover 201 at the time of bending the support members 207, so that the support members 207 can be bent in a forward direction of the back cover 201 while being prevented from being bent or deformed in an opposite direction, i.e. in a rearward direction of the back cover 201.

That is, as the space between the support member 207 and the fixing member 208 increases, a degree of curvature change of the back cover 201 may decrease. Accordingly, the guide member 201a may bring the support members 207 into close contact with the fixing members 208, so that the curvature of the back cover 201 may be changed according to the degree of bending of the support members 207 without decreasing the degree of curvature change.

The fixing members 208 are respectively provided with a screw portion on an inner circumferential surface thereof and are screw-coupled to the guide members 201a. The fixing members 208 herein may be implemented as a welding nut or a PEM nut, fixed to the back cover 201 through welding or bonding. The welding nuts are illustrated in FIG. 6 as being coupled to the back cover 201 as an example of the fixing members 208. In this case, the guide members 201a are screw-coupled to the welding nuts while supporting the support members 207 toward the back cover 201 in a state in which the welding nuts are fixed to the back cover 201.

However, exemplary embodiments are not necessarily limited thereto, and the guide members 201a may not have screw portions formed on the outer circumference thereof and may be press-fitted into the welding nuts.

In addition, spacers 206 are coupled to the outer ends of the support members 207. The spacers 206 and the support members 207 are fixed to the rear surface of the back cover 201 using fastening members 207b. This configuration serves to reduce or prevent the back cover 201 from being damaged and deformed when loads are applied thereto. The thickness of the spacers 206 may be changed to induce bending of the support members 207 at the beginning of a curvature change performed by the user.

That is, when the spacers 206 are coupled to the back cover 201 by reducing the thickness of the spacers 206 such that the distance from both sides of the rear surface of the back cover 201 to the outer ends of the supports members 207 is shorter than the distance from the central portion of the rear surface of the back cover 201, in which the curvature-changing unit 210 is located, to the inner ends of the support members 207 so that the support members 207 is caused to be bent, the support members 207 are mounted in a state of being bent by a small amount. Consequently, the support members 207 can be more easily bent at the beginning of the curvature change operation.

As described above, according to the exemplary embodiments of the present disclosure, the user may change a curvature of a display device between a flat mode and a curved mode. In particular, the user can easily change a curvature of a display device, even for a large-sized display device, to be able to meet various user demands.

Although the exemplary embodiments of the present disclosure have been described for illustrative purposes, a person skilled in the art will appreciate that various modifications and applications are possible without departing from the essential characteristics of the present disclosure. For example, the specific components of the exemplary embodiments may be variously modified.

It will be understood that the terms "comprise," "include," "have," and any variations thereof used herein are intended to cover a non-exclusive inclusion unless explicitly described to the contrary. Unless otherwise defined, all terms including technical and scientific terms used herein have the same meaning as commonly understood by a person skilled in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The foregoing descriptions and the accompanying drawings have been presented in order to explain the certain principles of the present disclosure. A person skilled in the art to which the disclosure relates could make many modifications and variations by combining, dividing, substituting for, or changing the elements without departing from the principle of the disclosure. The foregoing embodiments disclosed herein shall be interpreted as illustrative only but not as limitative of the principle and scope of the disclosure. It should be understood that the scope of the disclosure shall be defined by the appended Claims and all of their equivalents fall within the scope of the disclosure.

What is claimed is:

1. A display device comprising:
   a back cover supporting a rear surface of a display panel;
   a pair of support members disposed on a left side and a right side of the back cover with respect to a central portion of the rear surface of the back cover, outer ends of the pair of support members being fixed to the back cover; and
   a curvature-changing unit coupled to the central portion of the rear surface of the back cover to support the pair of support members in a lateral direction of the back cover and change a curvature of either the display panel or the back cover,
   wherein the curvature-changing unit comprises:
      support protrusions disposed on central portions of inner ends in the support members;
      a driven gear having first support holes extending in a circumferential direction such that a distance of each of the first support holes to a center of the driven gear increases from one end to another end thereof, the support protrusions being accommodated into the first support holes to move along the first support holes, seating recesses disposed on both sides of the first support holes, the inner ends of the support members being seated on the seating recesses;
      a driving gear meshed with the driven gear to rotate the driven gear;
      a driven gear support plate coupled to the driven gear and having second support holes corresponding to the first support holes, the support protrusions being accommodated in the second support holes; and
      a housing accommodating the driven gear and the driving gear and coupled to the rear surface of the back cover.

2. The display device according to claim 1, wherein the driven gear has a first coupling hole disposed in a central portion thereof having a circular plate shape, the first coupling hole being coupled to a first rotation shaft of the housing, the driven gear comprising a first gear portion protruding from a portion an outer circumferential surface thereof in a diameter direction and meshed with the driving gear.

3. The display device according to claim 2, wherein the driving gear comprises a second gear portion meshed with the driven gear and a knob disposed in a position spaced apart from the second gear portion in an axial direction thereof, the driving gear having a second coupling hole extending through the second gear portion and the knob, the housing comprising a second rotation shaft fitted into the second coupling hole.

4. The display device according to claim 3, wherein the housing comprises:
   a lower housing coupled to the back cover and having a gear accommodation recess in which the driven gear and the driving gear are accommodated; and
   an upper housing having a through-hole through which the knob of the driving gear extends and a support member accommodation recess in both sides of which the support members are accommodated, the upper housing being coupled to the lower housing while surrounding the driven gear support plate.

5. The display device according to claim 4, wherein the curvature-changing unit further comprises a rotation lever coupled to an outer surface of the housing, the driving gear being rotated using the rotation lever, the knob of the driving gear and the rotation lever having fastening holes to fastening members are fastened.

6. The display device according to claim 5, wherein the rotation lever comprises a grasping portion protruding from a rotation lever body.

7. A display device comprising:
   a back cover supporting a rear surface of a display panel;
   a pair of support members disposed on a left side and a right side of the back cover with respect to a central portion of the rear surface of the back cover, outer ends of the pair of support members being fixed to the back cover; and
   a curvature-changing unit coupled to the central portion of the rear surface of the back cover to support the pair of support members in a lateral direction of the back cover and change a curvature of either the display panel or the back cover,
   wherein each of the support members has a slit-shaped guide hole extending in the lateral direction of the back cover, fixing members are disposed on the rear surface of the back cover in positions corresponding to the guide holes of the support members, and guide members are coupled to the fixing members through the guide holes and support the support members.

8. The display device according to claim 7, wherein the fixing members respectively comprise a screw portion on an inner circumferential surface thereof and are screw-coupled to the guide members.

9. A display device comprising:
   a back cover supporting a rear surface of a display panel;
   a pair of support members disposed on a left side and a right side of the back cover with respect to a central portion of the rear surface of the back cover, outer ends of the pair of support members being fixed to the back cover; and
   a curvature-changing unit coupled to the central portion of the rear surface of the back cover to support the pair of support members in a lateral direction of the back cover and change a curvature of either the display panel or the back cover,
   wherein the curvature-changing unit further comprises spacers coupled to the outer ends of the pair of the support members, the spacers being fixed to the rear surface of the back cover using fastening members.

* * * * *